(12) United States Patent
Zhang

(10) Patent No.: US 9,305,604 B2
(45) Date of Patent: Apr. 5, 2016

(54) DISCRETE THREE-DIMENSIONAL VERTICAL MEMORY COMPRISING OFF-DIE ADDRESS/DATA-TRANSLATOR

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 14/707,023

(22) Filed: May 8, 2015

(65) Prior Publication Data

US 2015/0269970 A1    Sep. 24, 2015

Related U.S. Application Data

(63) Continuation-in-part of application No. 14/636,359, filed on Mar. 3, 2015, now Pat. No. 9,123,393, which is a continuation-in-part of application No. 14/047,011, filed on Oct. 6, 2013, now Pat. No. 9,093,129, which is a continuation-in-part of application No. 13/787,787, filed on Mar. 6, 2013, now Pat. No. 8,890,300, which is a continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
| | |
|---|---|
| *G11C 5/02* | (2006.01) |
| *G11C 8/00* | (2006.01) |
| *G11C 5/14* | (2006.01) |
| *G11C 7/00* | (2006.01) |

(Continued)

(52) U.S. Cl.
CPC ........ *G11C 5/02* (2013.01); *G11C 5/145* (2013.01); *G11C 7/00* (2013.01); *G11C 8/00* (2013.01); *G11C 8/14* (2013.01); *G11C 13/0023* (2013.01); *G11C 13/0002* (2013.01); *G11C 2213/71* (2013.01); *H01L 24/13* (2013.01); *H01L 24/16* (2013.01); *H01L 24/48* (2013.01); *H01L 24/73* (2013.01); *H01L 25/0657* (2013.01); *H01L 25/105* (2013.01); *H01L 2224/13101* (2013.01); *H01L 2224/16145* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2225/1023* (2013.01); *H01L 2225/1064* (2013.01); *H01L 2924/00014* (2013.01)

(58) Field of Classification Search
CPC ........... H01L 2924/00014; H01L 2224/48091; H01L 2225/06562; G11C 5/02; G11C 5/145; G11C 8/14; G11C 7/00; G11C 5/14
USPC ................ 257/296, 303, 311, 314, 315, 686; 438/238, 241, 257, 258, 262, 264, 266
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |

(Continued)

*Primary Examiner* — Kyoung Lee
*Assistant Examiner* — Ratisha Mehta

(57) ABSTRACT

The present invention discloses a discrete three-dimensional vertical memory (3D-$M_V$). It comprises at least a 3D-array die and at least an A/D-translator die. The 3D-array die comprises a plurality of vertical memory strings. At least an address/data (A/D)-translator for the 3D-array die is located on the A/D-translator die instead of the 3D-array die. The 3D-array die and the A/D-translator die have substantially different back-end-of-line (BEOL) structures.

20 Claims, 11 Drawing Sheets

(51) Int. Cl.
*G11C 8/14* (2006.01)
*G11C 13/00* (2006.01)
*H01L 23/00* (2006.01)
*H01L 25/065* (2006.01)
*H01L 25/10* (2006.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 6,903,427 B2 | 6/2005 | Zhang |
| 7,386,652 B2 | 6/2008 | Zhang |
| 7,423,304 B2 | 9/2008 | Cleeves et al. |
| 7,449,376 B2 | 11/2008 | Isobe et al. |
| 7,728,391 B2 | 6/2010 | Zhang |
| 8,325,527 B2 | 12/2012 | Jin et al. |
| 8,345,479 B2 | 1/2013 | Maejima |
| 8,519,472 B2 | 8/2013 | Jeong et al. |
| 8,638,611 B2 | 1/2014 | Sim et al. |
| 2006/0192294 A1* | 8/2006 | Lee ............... 257/778 |
| 2007/0252153 A1 | 11/2007 | Koyama |
| 2008/0130342 A1 | 6/2008 | Zhang |
| 2008/0159722 A1 | 7/2008 | Zhang |
| 2008/0261544 A1* | 10/2008 | Blin ............... 455/121 |
| 2009/0032949 A1* | 2/2009 | Goswami ........ 257/741 |
| 2009/0073795 A1 | 3/2009 | Pyeon |
| 2010/0208503 A1 | 8/2010 | Kuo |
| 2011/0216603 A1* | 9/2011 | Han et al. ......... 365/185.23 |
| 2011/0298037 A1 | 12/2011 | Choe et al. |
| 2012/0155168 A1 | 6/2012 | Kim et al. |
| 2012/0218817 A1 | 8/2012 | Kang et al. |
| 2013/0003480 A1* | 1/2013 | D'Abreu et al. ....... 365/218 |
| 2013/0126957 A1 | 5/2013 | Higashitani et al. |
| 2013/0151760 A1 | 6/2013 | Cho et al. |
| 2014/0063938 A1 | 3/2014 | Oh et al. |

\* cited by examiner

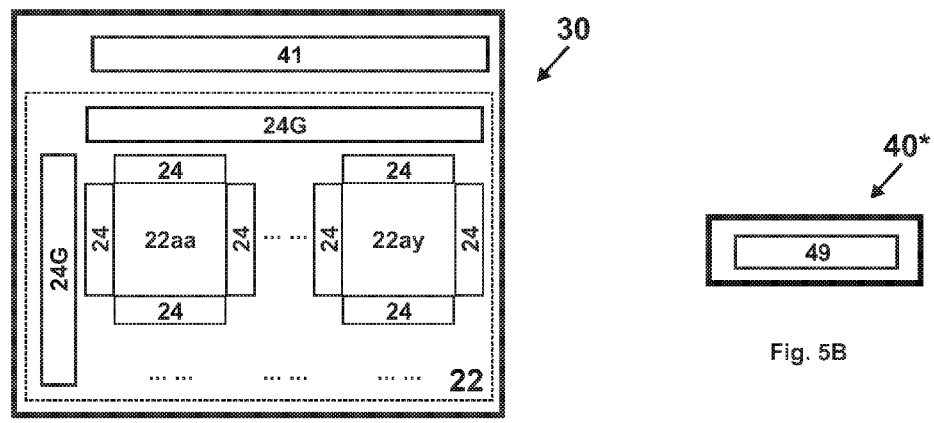
Fig. 5A
Fig. 5B
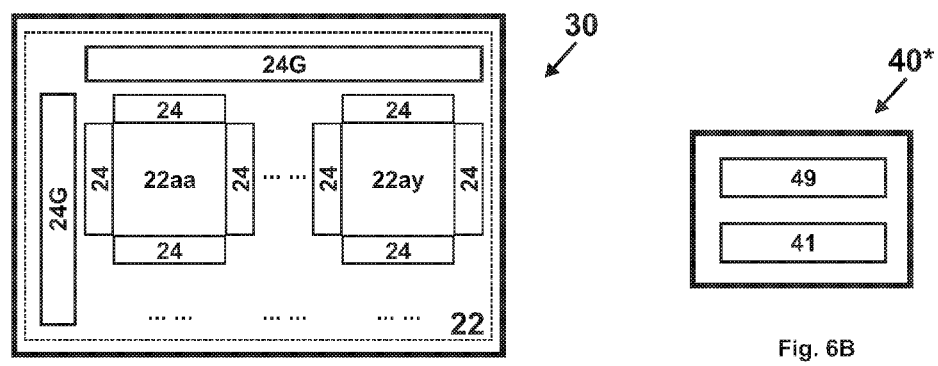
Fig. 6A
Fig. 6B

US 9,305,604 B2

DISCRETE THREE-DIMENSIONAL VERTICAL MEMORY COMPRISING OFF-DIE ADDRESS/DATA-TRANSLATOR

CROSS-REFERENCE TO RELATED APPLICATIONS

This is a continuation-in-part of application "Discrete Three-Dimensional Vertical Memory", application Ser. No. 14/636,359, filed Mar. 3, 2015, which is a continuation-in-part of application "Discrete Three-Dimensional Memory Comprising Dice with Different BEOL Structures", application Ser. No. 14/047,011, filed Oct. 6, 2013, which is a continuation-in-part of application "Discrete Three-Dimensional Memory Comprising Off-Die Read/Write-Voltage Generator", application Ser. No. 13/787,787, filed Mar. 6, 2013, which is a continuation-in-part of application "Discrete Three-Dimensional Memory", application Ser. No. 13/591,257, filed Aug. 22, 2012, which claims benefit of a provisional application "Three-Dimensional Memory with Separate Memory-Array and Peripheral-Circuit Substrates", application Ser. No. 61/529,929, filed Sep. 1, 2011.

BACKGROUND

1. Technical Field of the Invention

The present invention relates to the field of integrated circuit, and more particularly to three-dimensional vertical memory (3D-$M_V$).

2. Prior Arts

Three-dimensional memory (3D-M) is a monolithic semiconductor memory comprising a plurality of vertically stacked memory cells. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further be a 3D-memristor, 3D-RRAM or 3D-ReRAM (resistive random-access memory), 3D-PCM (phase-change memory), 3D-PMC (programmable metallization-cell memory), or 3D-CBRAM (conductive-bridging random-access memory).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate-circuit level 0K and a plurality of vertically stacked memory levels 16A, 16B. The substrate-circuit level 0K comprises substrate transistors 0t and substrate interconnects 0i. The substrate transistors 0t are formed in a semiconductor substrate 0. The substrate interconnects 0i are the interconnects for the substrate transistor 0t. In this example, the substrate interconnects 0i includes metal layers 0M1, 0M2. Hereinafter, the metal layers 0M1, 0M2 in the substrate interconnects 0i are referred to as substrate interconnect layers; the materials used in the substrate interconnects 0i are referred to as substrate interconnect materials.

The memory levels 16A, 16B are stacked above the substrate-circuit level 0K. They are coupled to the substrate 0 through contact vias (e.g., 1av). Each of the memory levels (e.g., 16A) comprises a plurality of upper address lines (e.g., 2a), lower address lines (e.g., 1a) and memory cells (e.g., 5aa). The memory cells could comprise diodes, transistors or other devices. Among all types of memory cells, the diode-based memory cells are of particular interest because they have the smallest size of ~$4F^2$, where F is the minimum feature size. Since they are generally located at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In one exemplary embodiment, diode is a semiconductor diode, e.g., p-i-n silicon diode. In another exemplary embodiment, diode is a metal-oxide diode, e.g., titanium-oxide diode, nickel-oxide diode.

The memory levels 16A, 16B form at least a 3D-M array 16, while the substrate-circuit level 0K comprises the peripheral circuit for the 3D-M array 16. A first portion of the peripheral circuit is located underneath the 3D-M array 16 and it is referred to as under-array peripheral circuit. A second portion of the peripheral circuit is located outside the 3D-M array 16 and it is referred to as outside-array peripheral circuits 18. Because the outside-array peripheral circuit 18 comprises significantly fewer back-end-of-line (BEOL) levels than the 3D-M array 16, the space 17 above the outside-array peripheral circuits 18 is empty and completely wasted. Hereinafter, a BEOL level refers to a level of conductive lines above the substrate. In FIG. 1A, the 3D-M array 16 comprises a total of six BEOL levels, including the two interconnect levels 0M1, 0M2, two address-line levels 1a, 2a for the first memory level 16A, and two address-line levels 3a, 4a for the second memory level 16B. The outside-array peripheral circuit 18 comprises only two BEOL levels, i.e., the interconnect levels 0M1, 0M2.

U.S. Pat. No. 7,383,476 issued to Crowley et al. on Jun. 3, 2008 discloses an integrated 3D-M die, whose 3D-arrays and peripheral circuit are integrated on a single die. As is illustrated in FIG. 1 B, an integrated 3D-M die 20 comprises a 3D-array region 22 and a peripheral-circuit region 28. The 3D-array region 22 comprises a plurality of 3D-M arrays (e.g., 22aa, 22ay) and their decoders (e.g., 24, 24G). These decoders include local decoders 24 and global decoders 24G. The local decoder 24 decodes address/data for a single 3D-M array, while the global decoder 24G decodes global address/data 25 to each 3D-M array.

The peripheral-circuit region 28 comprises all necessary peripheral-circuit components for a standalone integrated 3D-M die 20 to perform basic memory functions, i.e., it can directly use the voltage supply 23 provided by a user (e.g., a host device), directly read data 27 from the user and directly write data 27 to the user. It includes a read/write-voltage generator ($V_R$/$V_W$-generator) 21 and an address/data (A/D)-translator 29. The $V_R$/$V_W$-generator 21 provides read voltage $V_R$ and/or write (programming) voltage $V_W$ to the 3D-M array(s). The A/D-translator 29 converts address and/or data from a logical space to a physical space and/or vice versa. Hereinafter, the logical space is the space viewed from the perspective of a user of the 3D-M, while the physical space is the space viewed from the perspective of the 3D-M.

The example in FIGS. 1A-1B is a three-dimensional horizontal memory (3-$M_H$), whose basic storage units are horizontal memory levels. The above description can also be applied to a three-dimensional vertical memory (3D-$M_V$), whose basic storage units are vertical memory strings.

U.S. Pat. No. 8,638,611 issued to Sim et al. on Jan. 28, 2014 discloses a 3D-$M_V$. It is a vertical-NAND. Besides vertical-NAND, the 3D-ROM, 3D-RAM, 3D-memristor, 3D-ReRAM or 3D-RRAM, 3D-PCM, 3D-PMC, 3D-CBRAM can also be arranged into 3D-$M_V$. As illustrated in FIG. 2, a 3D-$M_V$ die 20 comprises at least a 3D-$M_V$ array 16 and a peripheral circuit 18. The 3D-$M_V$ array 16 comprises a plurality of vertical memory strings 16X, 16Y. Each memory string (e.g., 16X) comprises a plurality of vertically stacked memory cells (e.g., 8a-8h). These memory cells are coupled by at least a vertical address line. Each memory cell (e.g., 8f) comprises at least a vertical transistor, with a gate 6, an information storage layer 7 and a vertical channel 9. The gate 6 of each memory cell (e.g., 8f) on a vertical memory string forms a BEOL level. In this example, the 3D-$M_V$ array 16 comprises eight BEOL levels, i.e., the memory levels 8a-8h.

Because the vertical memory strings 16X, 16Y in 3D-$M_V$ include a portion of the substrate 0A and no peripheral circuit can be formed there-under (FIG. 2), the 3D-$M_V$ die 20 could only comprise outside-array peripheral circuit 18. This is different from 3D-$M_H$ (FIG. 1A), which could comprise an under-array peripheral circuit. The peripheral circuit 18 for the 3D-$M_V$ array 16 comprises substrate transistors 0t and substrate interconnects 0i. The substrate transistors 0t are conventional (horizontal) transistors formed in the semiconductor substrate 0. The substrate interconnects 0i are the interconnects for the substrate transistor 0t. In this example, the peripheral circuit 18 comprises two BEOL levels, i.e., the interconnect levels 0M1, 0M2.

The prior-art 3D-$M_V$ is an integrated 3D-$M_V$, whose 3D-$M_V$ array 16 and peripheral circuit 18 are integrated into a single 3D-$M_V$ die 20. Because their manufacturing processes are not compatible, the 3D-$M_V$ array 16 and its peripheral circuit 18 are formed separately. Accordingly, the 3D-$M_V$ die 20 of FIG. 2 comprises ten BEOL levels, including eight memory levels for the 3D-$M_V$ array 16 and two interconnect levels for the peripheral circuit 18.

It is a prevailing belief in the field of integrated circuit that more integration is better, because integration lowers cost and improves performance. However, this belief is no longer true for 3D-$M_V$. First of all, because the vertical memory strings 16X, 16Y comprises significantly more BEOL levels than the peripheral circuit 18, integrating would force a relatively simple peripheral circuit 18 to use the expensive BEOL manufacturing process of the 3D-$M_V$ array 16. This increases the overall 3D-$M_V$ cost. Secondly, as the 3D-$M_V$ 20 is optimized for its 3D-$M_V$ array 16, the performance of its peripheral circuit 18 is sacrificed. For example, the peripheral circuit 18 may comprise just a small number of interconnect levels (e.g., as few as two), or comprise high-temperature interconnect materials whose speed is generally slower (e.g., tungsten for conductive material and silicon oxide for insulating material). This degrades the overall 3D-$M_V$ performance.

OBJECTS AND ADVANTAGES

It is a principle object of the present invention to provide a three-dimensional vertical memory (3D-$M_V$) with a lower overall cost.

It is a further object of the present invention to provide a 3D-$M_V$ with an improved overall performance.

In accordance with these and other objects of the present invention, a discrete 3D-$M_V$ comprising off-die address/data-translator is disclosed.

SUMMARY OF THE INVENTION

To lower the overall 3D-$M_V$ cost and/or improve the overall 3D-$M_V$ performance, the present invention follows this design guideline: separate the 3-D circuit and 2-D circuit into different dice in such a way that they could be optimized separately. For example, the 3D-$M_V$ array (3-D circuit) and the address/data (A/D)-translator (2-D circuit) are separated into different dice. Accordingly, the present invention discloses a discrete 3D-$M_V$. It comprises at least a 3D-array die and at least an A/D-translator die. The 3D-array die is formed in a 3-D space and comprises a plurality of functional levels, i.e., a plurality of vertically stacked memory cells. The A/D-translator die is formed on a 2-D plane and comprises just a single functional level, i.e., at least an A/D-translator.

Designed and manufactured separately, the 3D-array die and the A/D-translator die in a discrete 3D-$M_V$ could have substantially different back-end-of-line (BEOL) structures. First of all, the A/D-translator die could comprise substantially fewer BEOL levels than the 3D-array die in such a way that the A/D-translator die has a much lower wafer cost than the 3D-array die (or, the integrated 3D-$M_V$ die). In one preferred embodiment, the number of memory cells on a memory string in the 3D-array die is substantially more than the number of interconnect levels in the A/D-translator die. Accordingly, the discrete 3D-$M_V$ has a lower overall cost than the integrated 3D-$M_V$. Secondly, the BEOL structures of the A/D-translator die could be independently optimized in such a way that its A/D-translator has a better performance than that of the integrated 3D-$M_V$ (or, the peripheral circuit of the 3D-array die). In a first preferred embodiment, the A/D-translator die comprises more interconnect levels than the peripheral circuit of the 3D-array die. In a second preferred embodiment, the A/D-translator die comprises high-speed interconnect materials (e.g., copper for conductive material and high-k dielectric for insulating material, whereas the peripheral circuit of the 3D-array die comprises high-temperature interconnect materials, whose speed is generally slower). Accordingly, the discrete 3D-$M_V$ has a better overall performance than the integrated 3D-$M_V$.

BRIEF DESCRIPTION OF THE DRAWINGS

FIGS. 5A-5B disclose a first preferred partitioning scheme;

FIGS. 6A-6B disclose a second preferred partitioning scheme;

It should be noted that all the drawings are schematic and not drawn to scale. Relative dimensions and proportions of parts of the device structures in the figures have been shown exaggerated or reduced in size for the sake of clarity and

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write-voltage generator ($V_R/V_W$-generator) could generate either only the read voltage, or only the write voltage, or both the read voltage and the write voltage. In another example, the address/data (A/D)-translator could translate either only address, or only data, or both address and data.

Figure 3A:
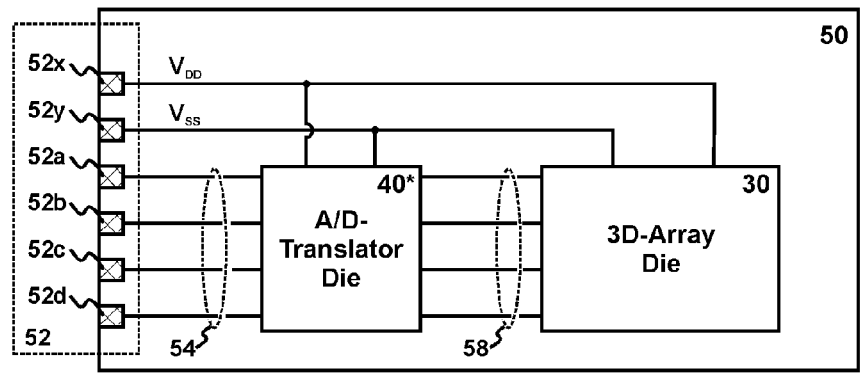
FIG. 3A illustrates a first preferred discrete 3D-$M_V$.
Figure 3B:
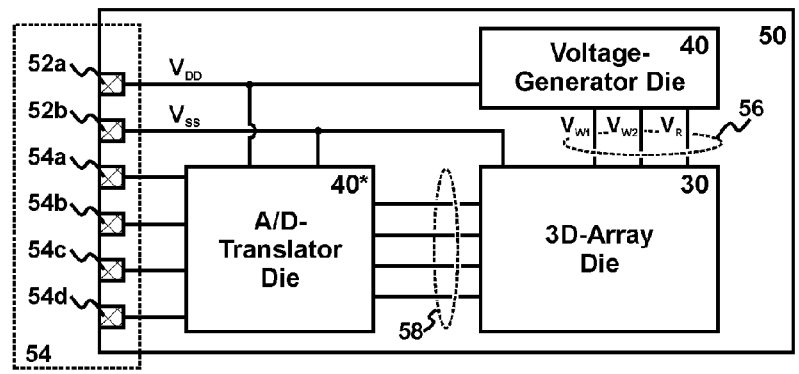
FIG. 3B illustrates a second preferred discrete 3D-$M_V$.
Figure 3C:
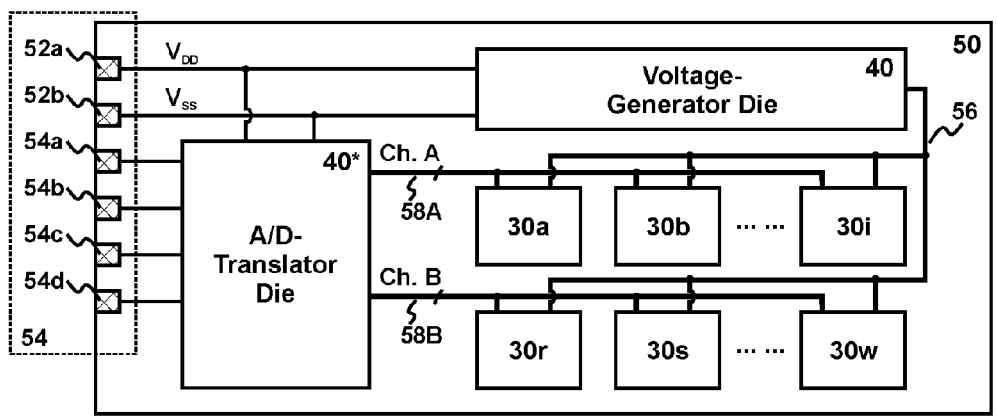
FIG. 3C illustrates a third preferred discrete 3D-$M_V$.

Referring now to FIGS. 3A-3C, three preferred discrete three-dimensional vertical memory (3D-$M_V$) 50 are disclosed. The discrete 3D-$M_V$ 50 includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52a is referred to as voltage supply $V_{DD}$. The ground contact 52b provides a ground connection at a voltage $V_{SS}$. The contacts 54a-54d provide signal connections between the host and the discrete 3D-$M_V$ 50. The signals represented on the contacts 54a-54d include address and data, among others. Because they are directly to/from the host, the address and data represented on the contacts 54a-54d are logical address and logical data.

The discrete 3D-$M_V$ 50 comprises at least a 3D-array die 30 and at least an A/D-translator die 40*. In these figures, at least an A/D-translator of the 3D-$M_V$ is located on the A/D-translator die 40* instead of the 3D-array die 30. This A/D-translator is an essential circuit for the 3D-$M_V$ to perform basic memory functions, e.g., directly using the data and/or address provided by the host. Without this A/D-translator, the 3D-array die 30 per se is not a functional memory.

The preferred discrete 3D-$M_V$ 50 in FIG. 3A is in the form of a memory card. Its A/D-translator die 40* comprises an A/D-translator, which includes an address converter and/or a data converter. The address converter converts the logical address represented on the contacts 54a-54d to the physical address represented on an internal bus 58 and/or vice versa; the data converter converts the logical data represented on the contacts 54a-54d to the physical data represented on an internal bus 58 and/or vice versa. The A/D-translator could convert address only, data only, or both address and data.

The preferred discrete 3D-$M_V$ 50 in FIG. 3B is also in the form of a memory card. It comprises two peripheral-circuit dice: a voltage-generator die 40 and an A/D-translator die 40*. The voltage-generator die 40 comprises a voltage generator and the A/D-translator die 40* comprises an A/D-translator. The voltage generator receives a voltage supply $V_{DD}$ from the power-supply contact 52a and provides the 3D-array die 30 with at least a read/write-voltage through a power bus 56.

The preferred discrete 3D-M 50 in FIG. 3C can be used for a high-capacity memory card or a solid-state drive. It comprises a plurality of 3D-array dice 30a, 30b . . . 30w. These 3D-array dice form two channels: Channel A and Channel B. The internal bus 58A on Channel A provides physical address/data to the 3D-array dice 30a, 30b . . . 30i, while the internal bus 58B on Channel B provides physical address/data to the 3D-array dice 30r, 30s . . . 30w. The power bus 56 provides the read/write-voltages to all 3D-array dice 30a, 30b . . . 30w. Although two channels are used in this example, it should be apparent to those skilled in the art that more than two channels may be used.

Figure 4A:
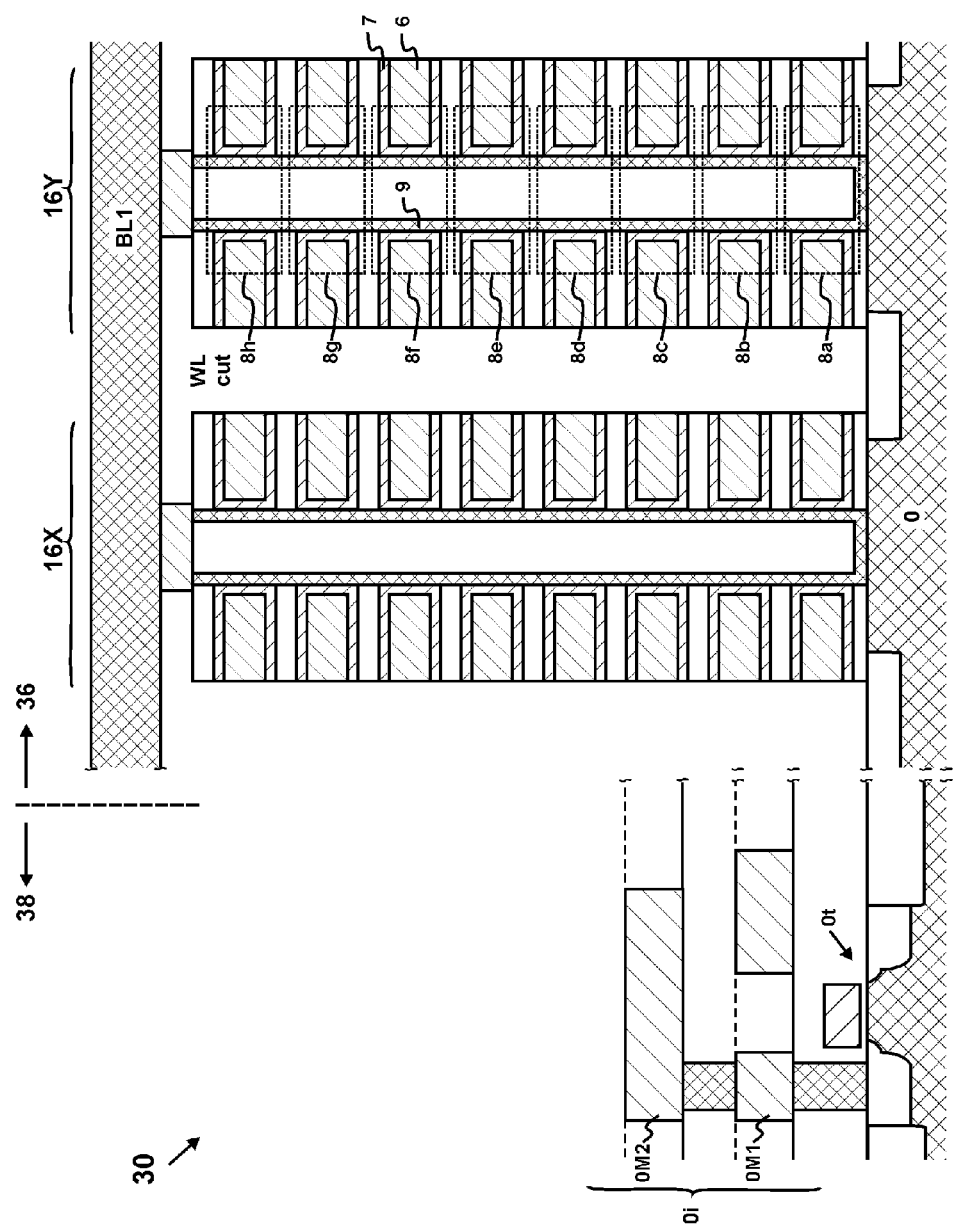
FIG. 4A is a cross-sectional view of a preferred 3D-array die.

Referring now to FIG. 4A, a cross-sectional view of a preferred 3D-array die 30 is disclosed. It comprises at least a 3D-$M_V$ array 36 and a peripheral circuit 38. The 3D-$M_V$ array 36 is formed in a 3-D space and comprises a plurality of vertical memory strings (e.g., 16X, 16Y). Each memory string (e.g., 16Y) comprises a plurality of vertically stacked memory cells (e.g., 8a-8h). These memory cells are coupled by at least a vertical address line. Each memory cell (e.g., 8f) comprises at least a vertical transistor, with gate 6, information storage layer 7 and channel 9. An exemplary memory cell is a vertical-NAND cell. For the 3D-$M_V$ array 36, the number of BEOL levels is equal to the number of memory cells on a vertical memory string (e.g., 16X). Alternatively, the number of BEOL levels could be larger than the number of memory cells on a vertical memory string. The 3D-$M_V$ array 36 of FIG. 4A comprises eight BEOL levels, i.e., the memory levels 8a-8h. A real-world 3D-$M_V$ array could comprise 24 or more BEOL levels.

Figure 1A:
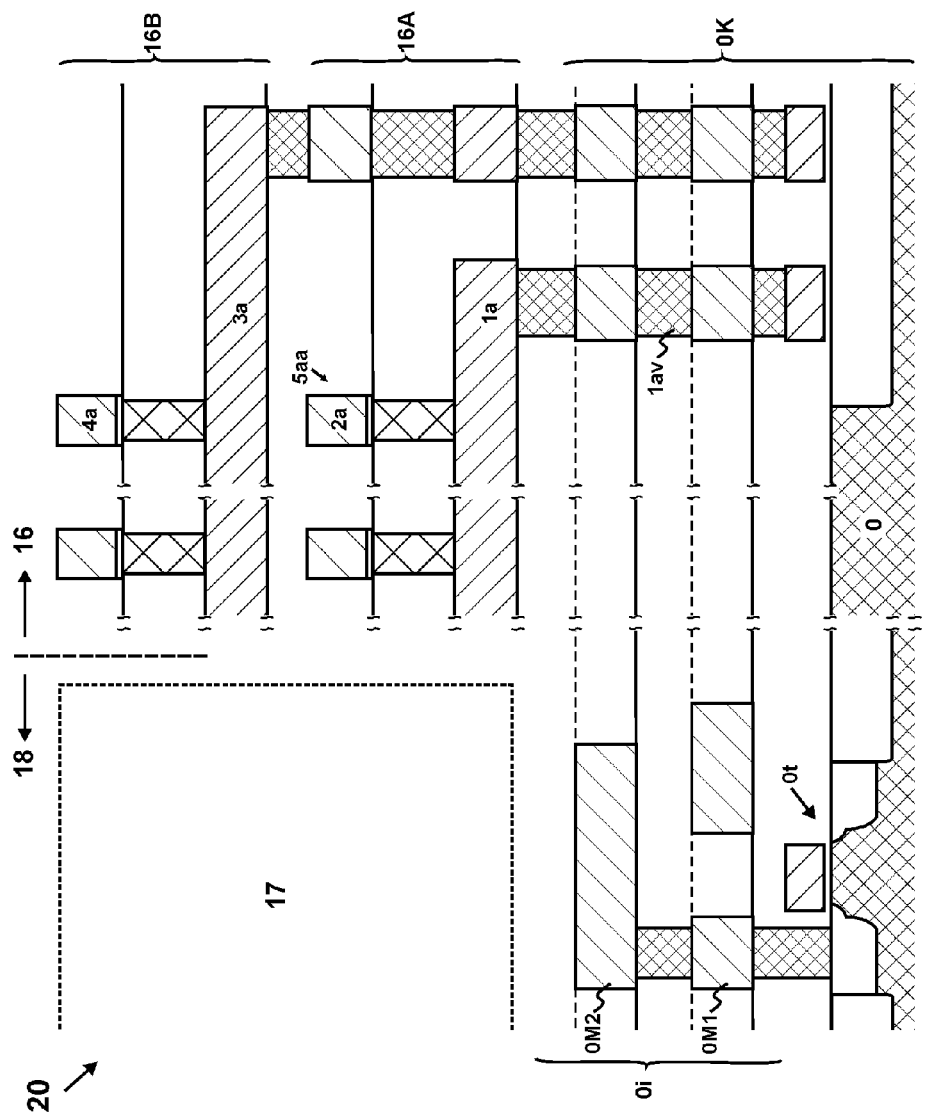
FIG. 1A is a cross-sectional views of an integrated three-dimensional horizontal memory (3D-$M_H$) (prior art)
Figure 1B:
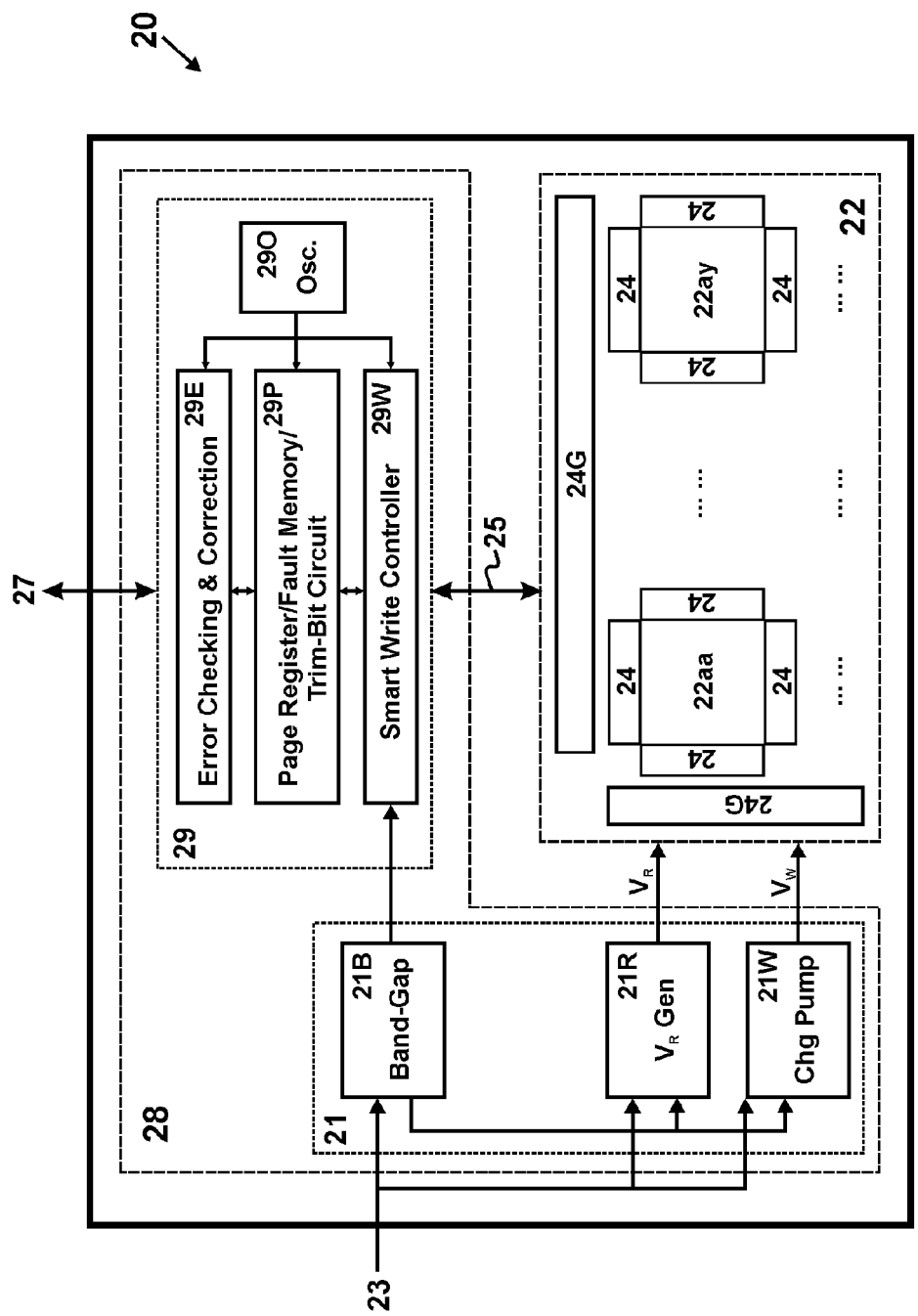
FIG. 1B is a block diagram of an integrated 3D-$M_H$ die (prior art)

The peripheral circuit 38 is located outside the 3D-$M_V$ array 36. It comprises substrate transistors 0t and substrate interconnects 0i. The substrate transistors 0t are conventional (horizontal) transistors formed in the semiconductor substrate 0. The substrate interconnects 0i are the interconnects for the substrate transistor 0t. In this preferred embodiment, the peripheral circuit 38 comprises two BEOL levels, i.e., the interconnect levels 0M1, 0M2. On the other hand, although its cross-sectional view is similar to that of the peripheral circuit 18 of FIG. 1A, the peripheral circuit 38 comprises fewer peripheral-circuit components. To be more specific, at least an A/D-translator is absent in the peripheral circuit 38. Further details on the peripheral circuit 38 are disclosed in FIGS. 5A-10B.

Figure 4B:
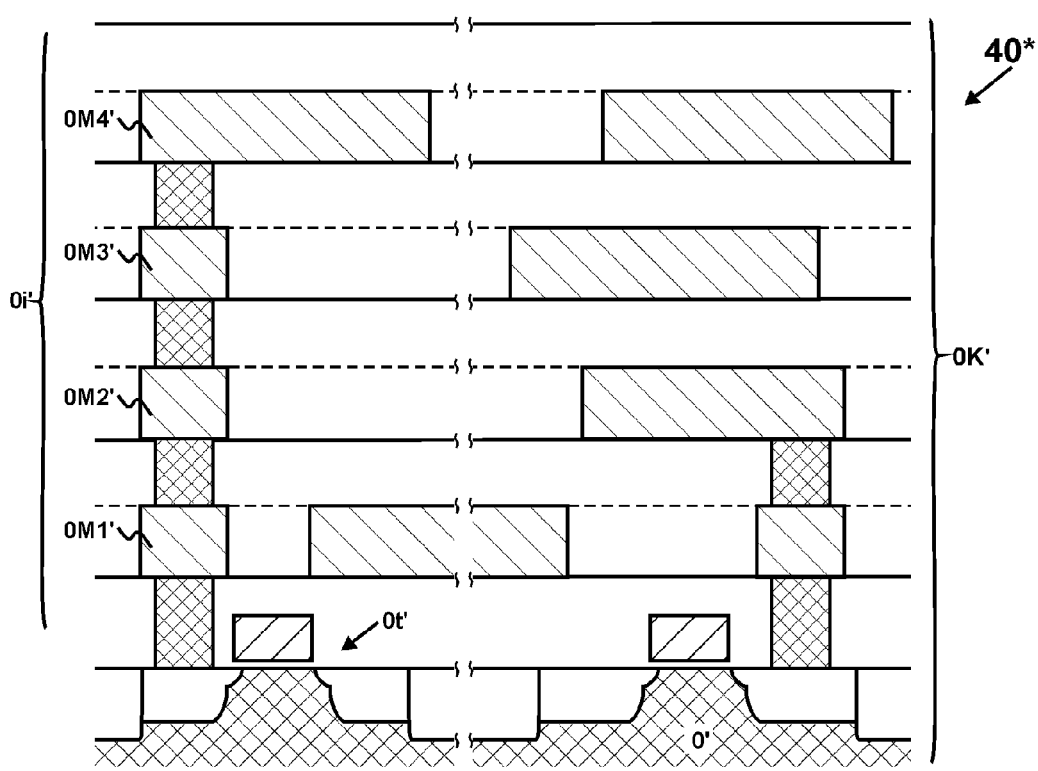
FIG. 4B is a cross-sectional view of a preferred A/D-translator die.

Referring now to FIG. 4B, a cross-sectional view of a preferred A/D-translator die 40* is disclosed. The A/D-translator die 40* is formed on a 2-D plane and includes a single functional level, i.e., the substrate-circuit level 0K'. The substrate-circuit level 0K' comprises substrate transistors 0t' and substrate interconnects 0i'. The substrate transistors 0t' are formed in a voltage generator substrate 0'. The substrate interconnects 0i' are the interconnects for the substrate transistor 0t'. In this preferred embodiment, the A/D-translator die 40* comprises four BEOL levels, i.e., the interconnect levels 0M1'-0M4'.

It is known that the manufacturing cost of an integrated circuit is roughly proportional to the number of its BEOL levels. Comprising much fewer BEOL levels (4 vs. 8), the A/D-translator die 40* has a much lower wafer cost than the 3D-array die 30. Because at least a portion of the discrete 3D-$M_V$ 50 (i.e., the off-die A/D-translator) has a lower cost than the integrated 3D-$M_V$ die 20 (with an in-die A/D-translator), the discrete 3D-$M_V$ 50 has a lower overall cost than the integrated 3D-$M_V$ 20.

In addition, the A/D-translator die 40* could comprise more interconnect levels (4 vs. 2) than the peripheral circuit 38 because it is not part of the 3D-array die 30. With more interconnect levels, the off-die A/D-translator (i.e., on the A/D-translator die 40*) is easier to design, have a better performance and occupy less chip area than that the in-die A/D-translator (i.e., on the integrated 3D-M$_V$ die 20). Note that, although it comprises more interconnect levels than the peripheral circuit 38, the A/D-translator die 40* still comprises significantly fewer BEOL levels (4 vs. 8) than the 3D-array die 30.

Furthermore, the A/D-translator die 40* may use high-speed interconnect materials for its interconnects 0$i$' (e.g., copper for conductive materials and low-k dielectric for insulating materials), because it does not have to go through any high-temperature BEOL processing steps. These high-speed interconnect materials can improve the performance of the A/D-translator die 40* and in turn, improve the overall 3D-M$_V$ performance.

For a conventional two-dimensional memory (2D-M, whose memory cells are arranged on a 2-D plane, e.g., flash memory), although it is possible to form at least a peripheral-circuit component on a peripheral-circuit die instead of a 2D-array die, doing so will increase the overall cost and degrade the overall performance. This is because the 2D-array die and the peripheral-circuit die have similar BEOL structures, similar wafer costs and similar performance. Adding the extra bonding cost and delay, a discrete 2D-M has a higher cost and a slower speed than an integrated 2D-M. This is in sharp contrast to the 3D-M$_V$. The 3D-array die 30 and A/D-translator die 40* of a discrete 3D-M$_V$ 50 have substantially different BEOL structures (e.g., different number of BEOL levels, different number of substrate interconnect levels, different substrate interconnect materials). As a result, a discrete 3D-M$_V$ has a lower overall cost and a better overall performance than an integrated 3D-M$_V$.

Different from the integrated 3D-M$_V$ 20, at least a peripheral-circuit component of the discrete 3D-M$_V$ 50 is located on the A/D-translator die 40* instead of the 3D-array die 30. In other words, the peripheral-circuit components of 3D-M$_V$ are partitioned between the 3D-array die 30 and the A/D-translator die 40*. Several preferred partitioning schemes are disclosed in FIGS. 5A-9B.

FIGS. 5A-5B disclose a first preferred partitioning scheme. The discrete 3D-M$_V$ 50 comprises a 3D-array die 30 and an A/D-translator die 40*. In FIG. 5A, the 3D-array die 30 comprises a plurality of 3D-M$_V$ arrays (e.g., 22aa, 22ay) and decoders. It also comprises an voltage generator 41. In FIG. 5B, the A/D-translator die 40* comprises at least an A/D-translator 49, which is absent from the 3D-array die 30 of FIG. 5A. Without the voltage generator 49, the 3D-array die 30 of FIG. 5A has a high array efficiency.

FIGS. 6A-6B disclose a second preferred partitioning scheme. The discrete 3D-M$_V$ 50 comprises a 3D-array die 30 and an A/D-translator die 40*. In FIG. 6A, the 3D-array die 30 comprises the 3D-M$_V$ arrays (e.g., 22aa, 22ay) and their decoders, but does not comprise the voltage generator 41 and the A/D-translator 49. In FIG. 6B, the A/D-translator die 40* comprises not only the A/D-translator 49, but also the voltage generator 41. The 3D-array die 30 of FIG. 6A has a very high array efficiency. This leads to a substantially lower overall cost for the discrete 3D-M$_V$.

Figure 7A:
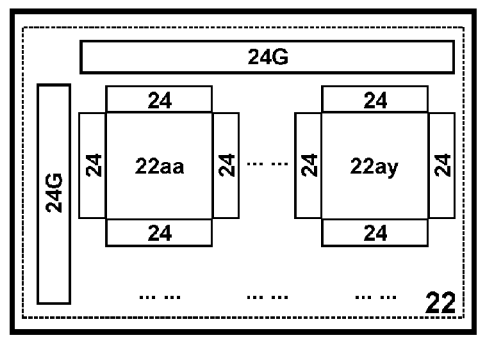
FIGS. 7A-7C disclose a third preferred partitioning scheme.
Figure 7B:
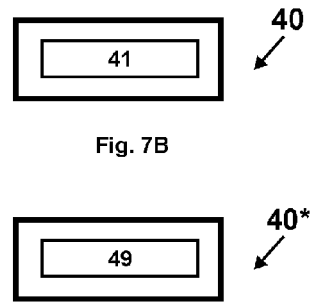
Figure 7C:
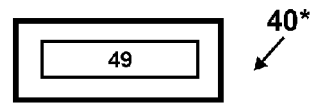

FIGS. 7A-7C disclose a third preferred partitioning scheme. The discrete 3D-M$_V$ 50 comprises a 3D-array die 30, a voltage-generator die 40 and an A/D-translator die 40*. The 3D-array die 30 (FIG. 7A) comprises 3D-M$_V$ arrays (e.g., 22aa, 22ay) and their decoders, but does not comprise the voltage generator 41 and the A/D-translator 49. The voltage generator 41 and the A/D-translator 49 are located on separate dice: the voltage generator 41 is located on the voltage-generator die 40 (FIG. 7B); the A/D-translator 49 is located on the A/D-translator die 40* (FIG. 7C). As is well known to those skilled in the art, the voltage generator is an analog-intensive circuit, whereas the A/D-translator is a digital-intensive circuit. Because they are located on separate dice, these circuits can be optimized independently: the voltage-generator die is optimized for analog performance, whereas the A/D-translator die is optimized for digital performance.

Figure 8A:
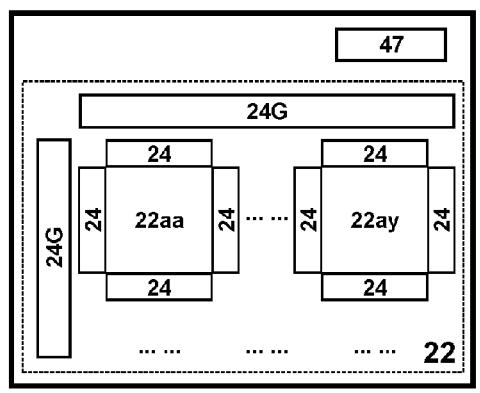
FIGS. 8A-8B disclose a fourth preferred partitioning scheme.
Figure 8B:
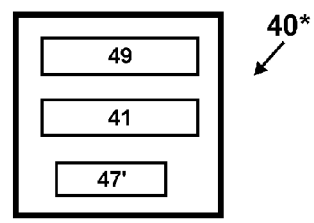

FIGS. 8A-8B disclose a fourth partitioning scheme. It is similar to those in FIGS. 6A-6B except that the 3D-array die 30 further comprises a first serializer-deserializer (SerDes) 47 (FIG. 8A). It converts parallel digital signals (e.g., address/data/command/status) inside the 3D-array die 30 to serial digital signals outside the 3D-array die 30 and vice versa. In the mean time, the A/D-translator die 40* comprise a second serializer-deserializer (SerDes) 47' (FIG. 8B). It converts parallel digital signals (e.g., address/data/command/status) inside the A/D-translator die 40* to serial digital signals outside the A/D-translator die 40* and vice versa. By serializing digital signals, the number of bond wires (or, solder bumps) can be reduced between the 3D-array die 30 and the A/D-translator die 40*. This helps to lower the bonding cost.

Figure 9A:
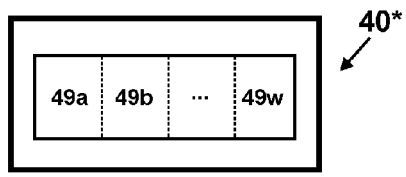
FIGS. 9A-9B are block diagrams of two preferred A/D-translator dice supporting multiple 3D-array dice.
Figure 9B:
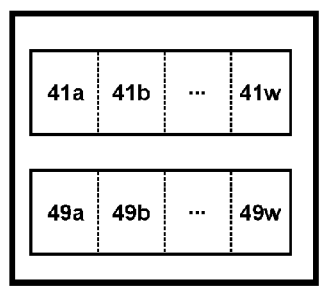

Referring now to FIGS. 9A-9B, two preferred A/D-translator dice 40 supporting multiple 3D-array dice are illustrated. The A/D-translator die 40* of FIG. 9A comprises a plurality of A/D-translators 49a, 49b . . . 49w. Each A/D-translator (e.g., 49a) translates address/data for an associated 3D-array die (e.g., 30a of FIG. 3C). The preferred A/D-translator die 40* of FIG. 9B further comprises a plurality of voltage generators 41a, 41b . . . 41w. Each voltage generator (e.g., 41a) provides read/write-voltages to an associated 3D-array die (e.g., 30a of FIG. 3C).

Figure 10A:
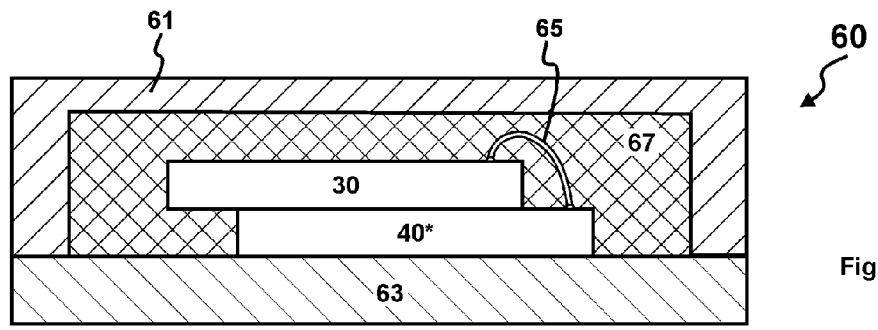
FIGS. 10A-10B are cross-sectional views of two preferred discrete 3D-$M_V$ packages.
Figure 10B:
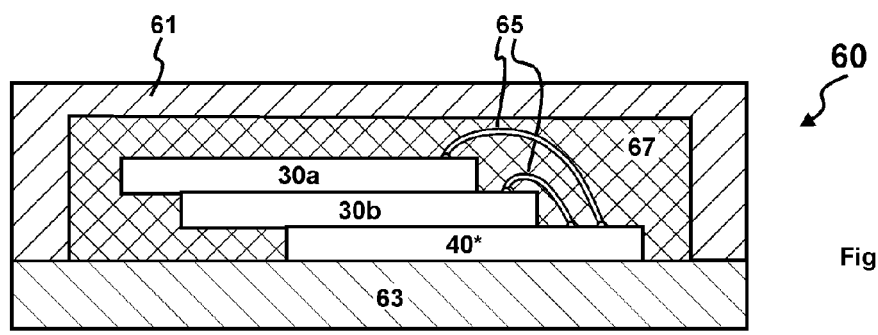
Figure 10C:
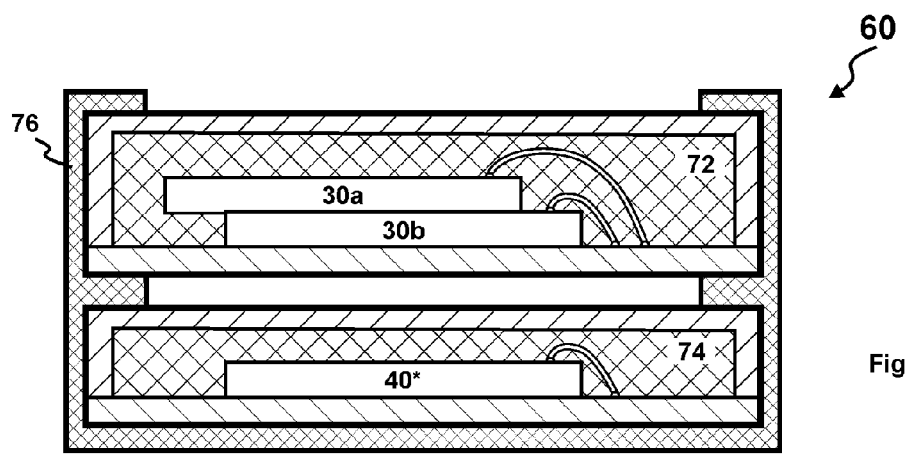
FIG. 10C is a cross-sectional view of a preferred discrete 3D-$M_V$ module.

Referring now to FIG. 10A-10C, several preferred discrete 3D-M$_V$ packages (or, module) 60 are disclosed. The 3D-M$_V$ packages in FIGS. 10A-10B are multi-chip package (MCP), while the 3D-M$_V$ module in FIG. 10C is a multi-chip module (MCM). These MCP and MCM can be used as a memory card and/or a solid-state drive.

The preferred discrete 3D-M$_V$ package 60 of FIG. 10A comprises two separate dice: a 3D-array die 30 and an A/D-translator die 40*. These dice 30, 40 are vertically stacked on a package substrate 63 and located inside a package housing 61. Bond wires 65 provide electrical connection between the dice 30 and 40. Here, bond wire 65 provides a coupling means between the 3D-array die 30 and the A/D-translator die 40*. Other exemplary coupling means include solder bump. To ensure data security, the dice 30, 40 are preferably encapsulated into a molding compound 67. In this preferred embodiment, the 3D-array die 30 is vertically stacked above the A/D-translator die 40*. Alternatively, the A/D-translator die 40* can be vertically stacked above the 3D-array die 30; or, the 3D-array die 30 can be stacked face-to-face towards the A/D-translator die 40*; or, the 3D-array die 30 can be mounted side-by-side with the A/D-translator die 40*.

The preferred discrete 3D-M$_V$ package 60 of FIG. 10B comprises two 3D-array dice 30a, 30b and an A/D-translator die 40*. These dice 30a, 30b, 40* are three separate dice. They are located inside a package housing 61. The 3D-array die 30a is vertically stacked on the 3D-array die 30b, and the 3D-array die 30b is vertically stacked on the A/D-translator die 40*. Bond wires 65 provide electrical connections between the dice 30A, 30B, and 40*.

The preferred discrete 3D-M$_V$ module 60 of FIG. 10C comprises a module frame 76, which houses two discrete packages, i.e., a 3D-array package 72 and a peripheral-circuit package 74. The 3D-array package 72 comprises two 3D-array dice 30a, 30b, while the peripheral-circuit package 74 comprises an A/D-translator die 40*. The module frame 76 provides electrical connections between the 3D-array package 72 and the peripheral-circuit package 74 (not drawn in this figure).

Figure 11A:
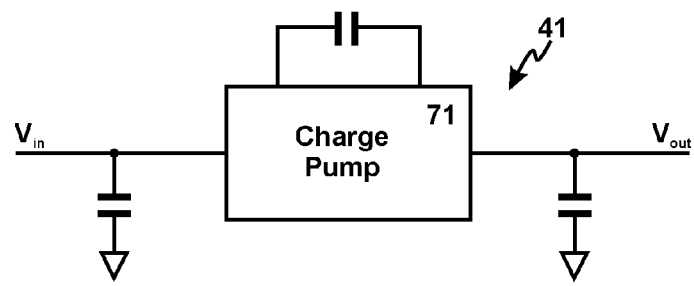
FIGS. 11A-11C are block diagrams of three preferred voltage generators.
Figure 11B:
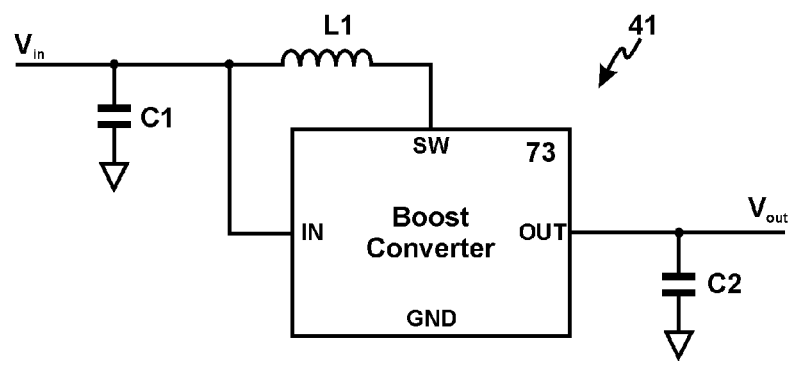
Figure 11C:
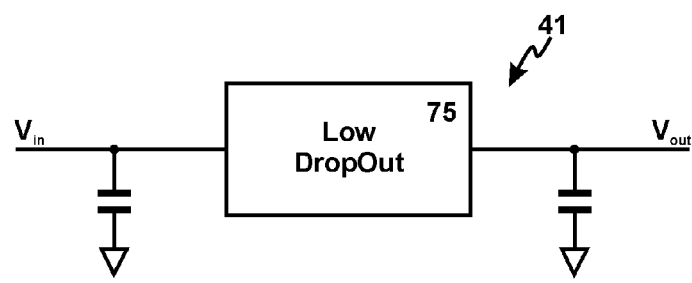

Referring now to FIGS. 11A-11C, three preferred voltage generators 41 are disclosed. The voltage generator 41 preferably uses a DC-to-DC converter. It could be a step-up, whose output voltage is higher than the input voltage, or a step-down, whose output voltage is lower than the input voltage. Examples of step-up include charge pump (FIG. 11A) and boost converter (FIG. 11B), and examples of step-down include low dropout (FIG. 11C) and buck converter.

In FIG. 11A, the voltage generator 41 includes a charge pump 71 to provide an output voltage $V_{out}$ that is higher than the input voltage $V_{in}$. The voltage generator 41 may include one or more integrated circuits and also include one or more discrete devices. Charge pump 71 may generally be formed having a low profile that fits within the physical constraints of low-profile memory cards.

In FIG. 11B, the voltage generator 41 is a high frequency boost converter 73. It may also be used to generate an output voltage $V_{out}$ that is higher than an input voltage $V_{in}$. A boost converter may be formed with a low profile inductor so that the profile of the $V_R/V_W$-generator is within the limits for a memory card or a solid-state drive.

In FIG. 11C, the voltage generator 41 includes a low dropout (LDO) 75 to provide an output voltage $V_{out}$ that is lower than the input voltage $V_{in}$. Generally, an LDO uses one or more (in this case, two) capacitors. Thus, the $V_R/V_W$-generator may be comprised of at least one die and may also include one or more discrete devices.

Figure 2:
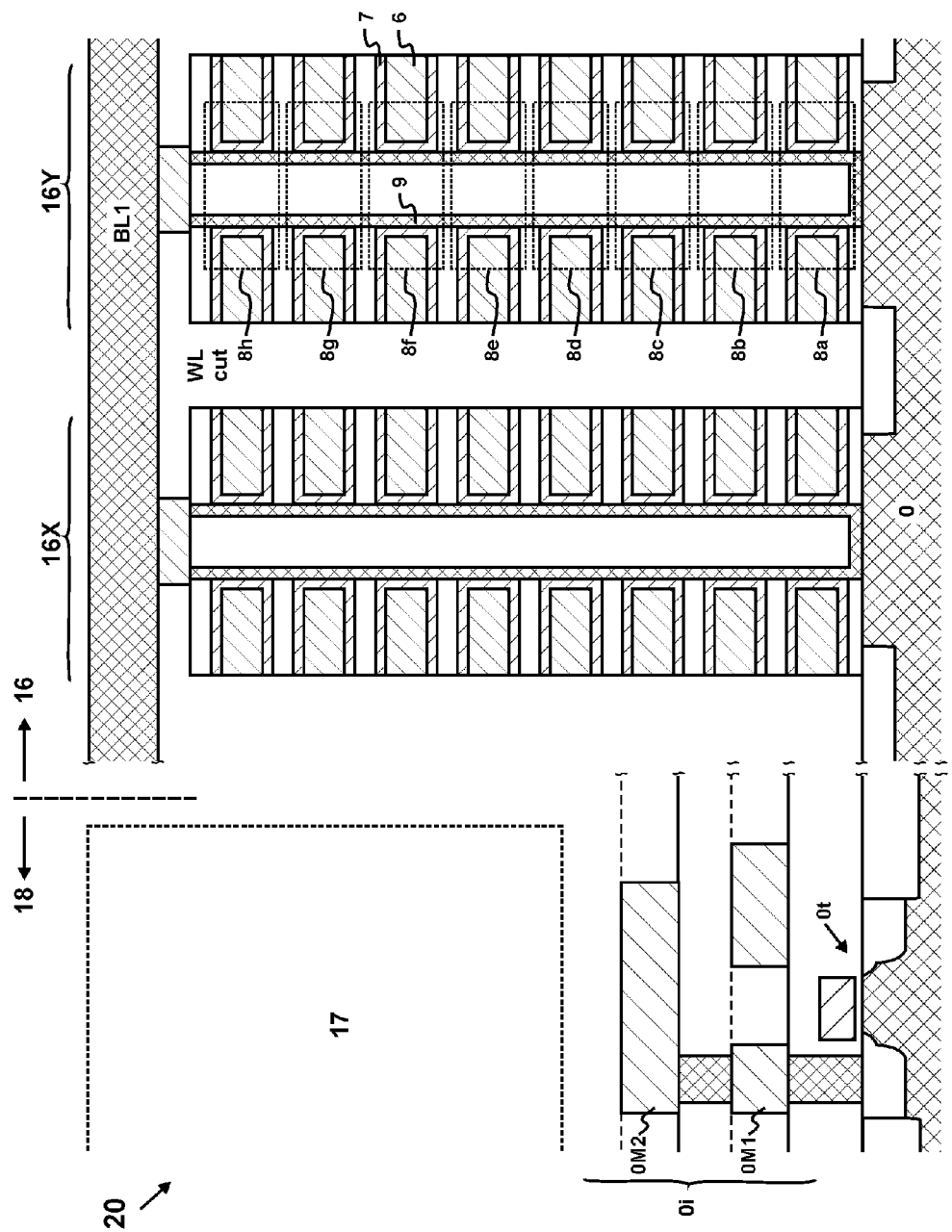
FIG. 2 is a cross-sectional view of an integrated three-dimensional vertical memory (3D-$M_V$) (prior art)
Figure 12A:
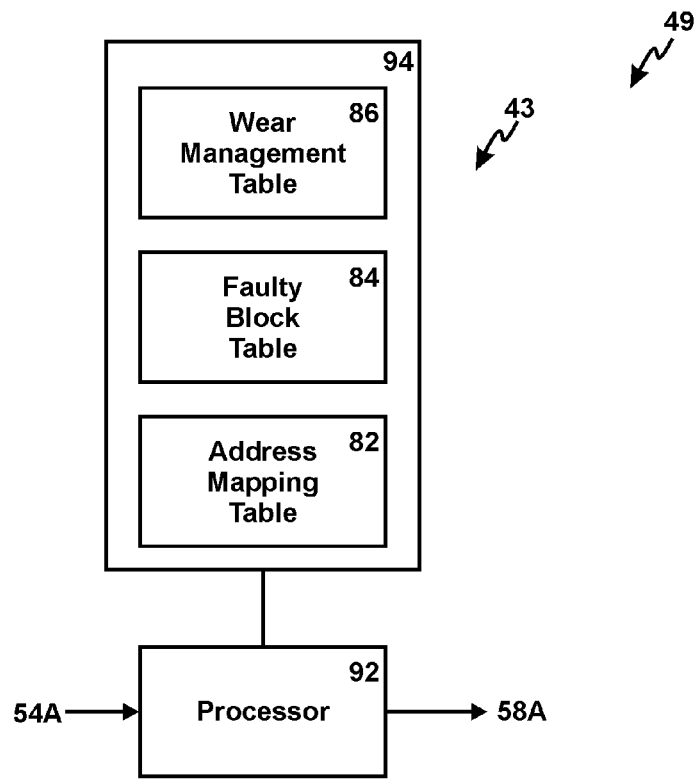
FIG. 12A is a block diagram of a preferred address translator.
Figure 12B:
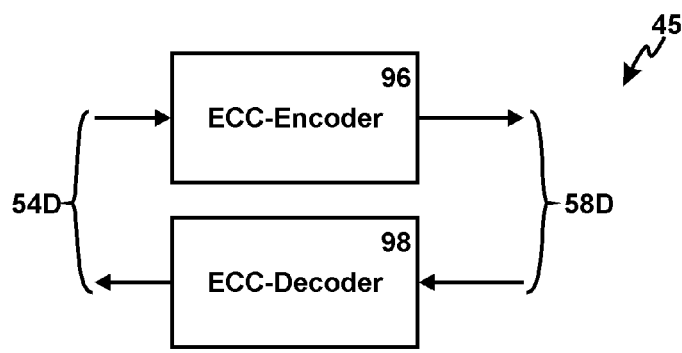
FIG. 12B is a block diagram of a preferred data translator.

Referring now to FIGS. 12A-12B, components of an A/D-translator 49, i.e. address translator 43 and data translator 45, are disclosed. FIG. 12A discloses a preferred address translator 43. It converts the logical address 54A it receives from the host to the physical address 58A of a 3D-array die. The address translator 43 comprises a processor 92 and a memory 94. The memory 94 stores at least an address mapping table 82, a faulty block table 84 and a wear management table 86. These tables 82, 84, 86 are permanently stored in a read-only memory (ROM), which could a non-volatile memory (NVM) such as flash memory. During operation, these tables 82, 84, 86 are loaded into a random-access memory (RAM) for faster access. When a single A/D-translator die 40\* supports multiple 3D-array dies (e.g. 30a, 30b . . . 30w, as shown in FIG. 2C), the memory 94 stores tables 82, 84, 86 for all 3D-array dies supported by the A/D-translator die 40\*. In other words, the memory 94 is shared by all 3D-array dies 30a, 30b . . . 30w.

Among tables 82, 84, 86 stored in the memory 94, the address mapping table 82 maintains links between the logical address and the physical address; the faulty block table 84 records the addresses of the faulty blocks in the 3D-$M_V$ array(s); and the wear management table 88 keeps a log of the number of read/write performed to each block. As used herein, the term "block" refers to an allocation unit of memory and can be any size ranging from a single memory cell to all of the memory cells in a 3D-$M_V$ array.

During read, upon receiving the input logical address 54A, the processor 94 looks up the address mapping table 82 and fetches the physical address 58A corresponding to the logical address 54A. During write, upon receiving the input logical address 54A, the processor 94 looks up the address mapping table 82, the faulty block table 84 and the wear management table 88 to choose an unused, good and less-used block to write the data. While the processor 94 outputs the physical address 58A of the chosen block, it writes this physical address 58A to the address mapping table 82.

FIG. 12B discloses a preferred data translator 45. It converts the logical data it receives from the host to the physical data of a 3D-array die, or converts the physical data of a 3D-array die to the logical data it outputs to the host. The data translator 45 comprises an ECC-encoder 96 and an ECC-decoder 98. The ECC-encoder 96 encodes the input logical data 54D to the physical data 58D, which are to be stored in the 3D-$M_V$ array. The ECC-decoder 98 decodes the physical data 58D retrieved from the 3D-$M_V$ array to the output logical data 54D. During this process, the error bits in the physical data 58D are detected and corrected. The ECC coding algorithms that are suitable for the 3D-$M_V$ include Reed-Solomon coding, Golay coding, BCH coding, Multi-dimensional parity coding, Hamming coding and others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional vertical memory (3D-$M_V$), comprising:
   a 3D-array die comprising at least a 3D-$M_V$ array, wherein said 3D-$M_V$ array comprises a plurality of vertical memory strings, each of said vertical memory strings comprising a plurality of vertically stacked memory cells;
   an A/D-translator die comprising at least a portion of an address/data-translator, wherein said portion of said address/data-translator is absent from said 3D-array die;
   means for coupling said 3D-array die and said A/D-translator die;
   wherein the number of memory cells on each of said vertical memory strings in said 3D-array die is substantially more than the number of interconnect levels in said A/D-translator die; and, said 3D-array die and said A/D-translator die are separate dice.

2. The memory according to claim 1, wherein said 3D-array die further comprises at least a peripheral circuit located outside said 3D-$M_V$ array, and the number of interconnect levels of said A/D-translator die is more than the number of interconnect levels of said peripheral circuit.

3. The memory according to claim 1, wherein said 3D-array die further comprises at least a peripheral circuit located outside said 3D-$M_V$ array, and said peripheral circuit and said A/D-translator die comprise different interconnect materials.

4. The memory according to claim 1, wherein said 3D-$M_V$ is a vertical-NAND.

5. The memory according to claim 1, wherein each of said memory cells comprises at least a vertical transistor.

6. The memory according to claim 1, wherein said 3D-$M_V$ is a three-dimensional read-only memory (3D-ROM) or a three-dimensional random-access memory (3D-RAM).

7. The memory according to claim 1, wherein said 3D-array die and said A/D-translator die are located in a memory package, a memory module, a memory card, or a solid-state drive.

8. The memory according to claim 1, further comprising another 3D-array die including at least another 3D-$M_V$ array, wherein said A/D-translator die comprises at least another portion of another address/data-translator for said another 3D-array die.

9. The memory according to claim 1, wherein said address/data-translator comprises at least an address translator and/or a data translator.

10. A discrete three-dimensional vertical memory (3D-$M_V$), comprising:
- a 3D-array die comprising at least a 3D-$M_V$ array and a peripheral circuit located outside said 3D-$M_V$ array, wherein said 3D-$M_V$ array comprises a plurality of vertical memory strings, each of said vertical memory strings comprising a plurality of vertically stacked memory cells;
- an A/D-translator die comprising at least a portion of an address/data-translator, wherein said portion of said address/data-translator is absent from said 3D-array die;
- means for coupling said 3D-array die and said A/D-translator die;
- wherein said peripheral circuit and said A/D-translator die comprise different interconnect materials; and, said 3D-array die and said A/D-translator die are separate dice.

11. The memory according to claim 10, wherein said peripheral circuit comprises high-temperature interconnect materials.

12. The memory according to claim 10, wherein said A/D-translator die comprises high-speed interconnect materials.

13. The memory according to claim 10, wherein the number of memory cells on each of said vertical memory strings in said 3D-array die is substantially more than the number of interconnect levels in said A/D-translator die.

14. The memory according to claim 10, wherein the number of interconnect levels of said A/D-translator die is more than the number of interconnect levels of said peripheral circuit.

15. The memory according to claim 10, wherein said 3D-$M_V$ is a vertical-NAND.

16. The memory according to claim 10, wherein each of said memory cells comprises at least a vertical transistor.

17. The memory according to claim 10, wherein said 3D-$M_V$ is a three-dimensional read-only memory (3D-ROM) or a three-dimensional random-access memory (3D-RAM).

18. The memory according to claim 10, wherein said 3D-array die and said A/D-translator die are located in a memory package, a memory module, a memory card, or a solid-state drive.

19. The memory according to claim 10, further comprising another 3D-array die including at least another 3D-$M_V$ array, wherein said A/D-translator die comprises at least another portion of another address/data-translator for said another 3D-array die.

20. The memory according to claim 10, wherein said address/data-translator comprises at least an address translator and/or a data translator.

* * * * *